United States Patent [19]

Harrison et al.

[11] Patent Number: 4,682,125
[45] Date of Patent: Jul. 21, 1987

[54] RF COIL COUPLING FOR MRI WITH TUNED RF REJECTION CIRCUIT USING COAX SHIELD CHOKE

[75] Inventors: William H. Harrison, Malibu; Mitsuaki Arakawa, Hillsborough; Barry M. McCarten, Piedmont, all of Calif.

[73] Assignee: The Regents of the University of California, Berkeley, Calif.

[21] Appl. No.: 827,638

[22] Filed: Feb. 10, 1986

[51] Int. Cl.$^4$ ............................................. H03H 7/01
[52] U.S. Cl. ...................................... 333/12; 324/318; 324/322; 333/176; 333/185; 333/207
[58] Field of Search ................... 333/12, 167, 184–185, 333/175–176, 206–207, 222–223, 219, 235; 324/307–322

[56] References Cited

U.S. PATENT DOCUMENTS

| | | | |
|---|---|---|---|
| 2,104,916 | 1/1938 | Evans | 333/229 X |
| 2,227,846 | 1/1941 | Rust | 333/222 |
| 2,419,907 | 4/1947 | Mole | 333/167 |
| 3,538,463 | 11/1970 | Pakan | 333/202 |

OTHER PUBLICATIONS

Murphy et al–"Balanced Matching *in vivo* NMR Probes for Improved Sensitivity", Society of Magnetic Resonance in Medicine, Second Annual Meeting, California, Aug. 16–19, 1985, Proceedings; pp. 248–249.
"The Radio Amateur's Handbook", 1976, published by The American Radio Relay League; pp. 579–580.

*Primary Examiner*—Marvin L. Nussbaum
*Attorney, Agent, or Firm*—Nixon & Vanderhye

[57] ABSTRACT

Undesirable RF coupling via the outside of an outer coaxial cable conductor to/from RF coils in a magnetic resonance imaging apparatus is minimized by employing a parallel resonance tuned RF choke in the circuit. The choke is realized by forming a short coiled section of the coaxial cable with a lumped fixed capacitance connected in parallel thereacross and a conductive tuning rod positioned within the center of the coiled section so as to trim the parallel resonant frequency to the desired value.

6 Claims, 9 Drawing Figures

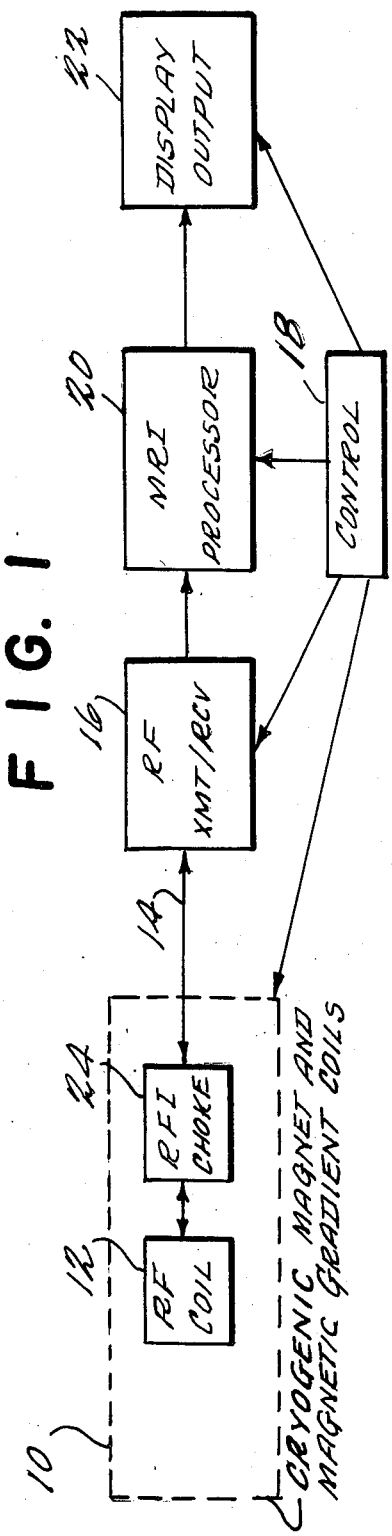
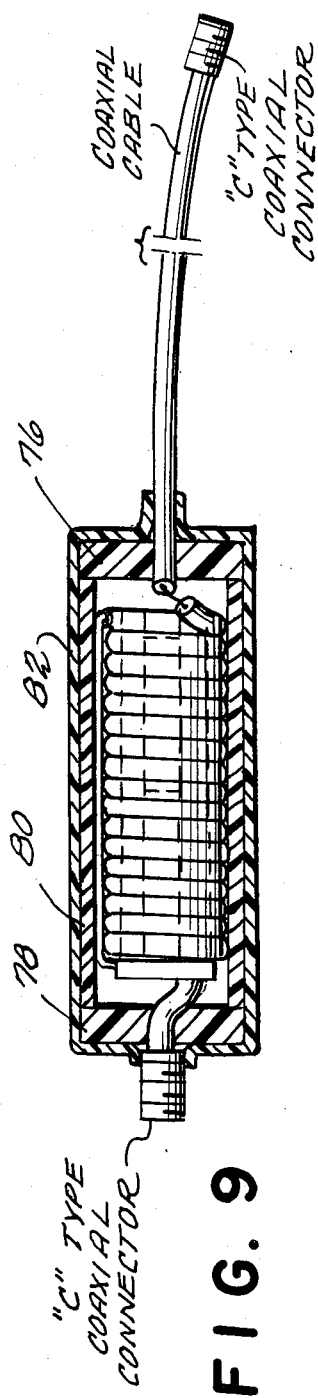
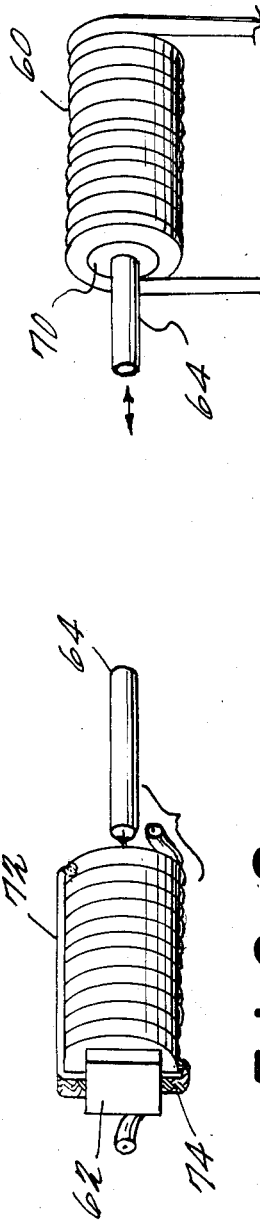

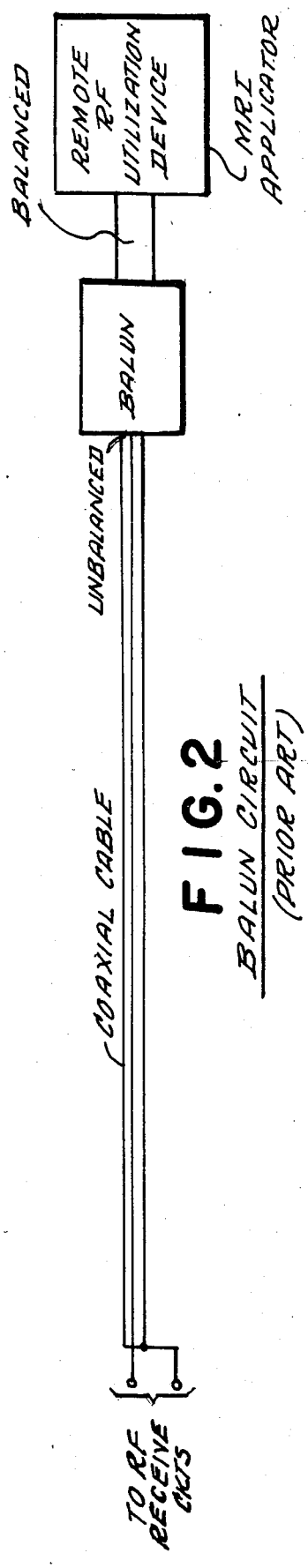
FIG.2 BALUN CIRCUIT (PRIOR ART)
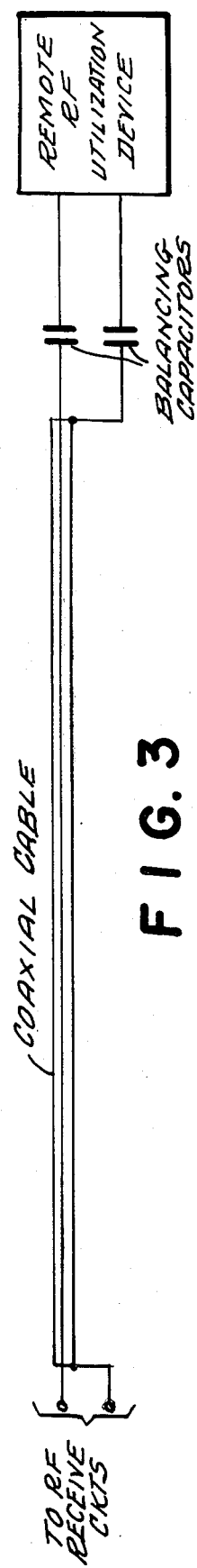
FIG.3 REACTANCE BALANCING CIRCUIT (PRIOR ART)
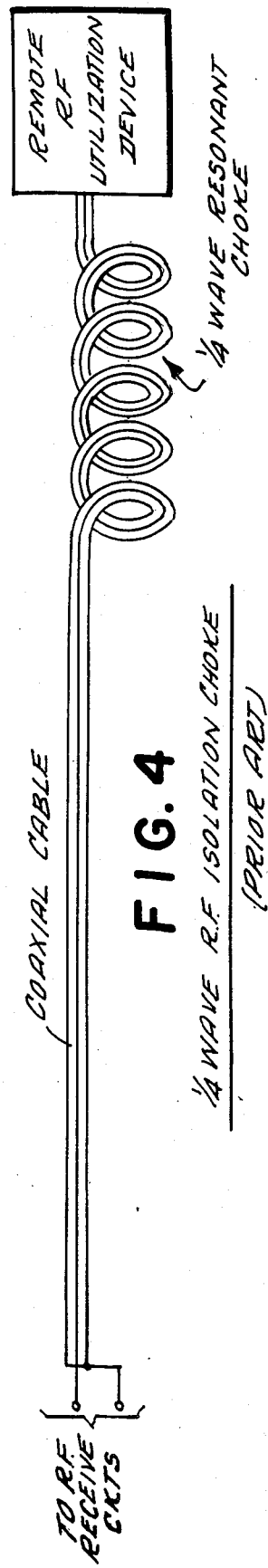
FIG.4 ¼ WAVE R.F. ISOLATION CHOKE (PRIOR ART)

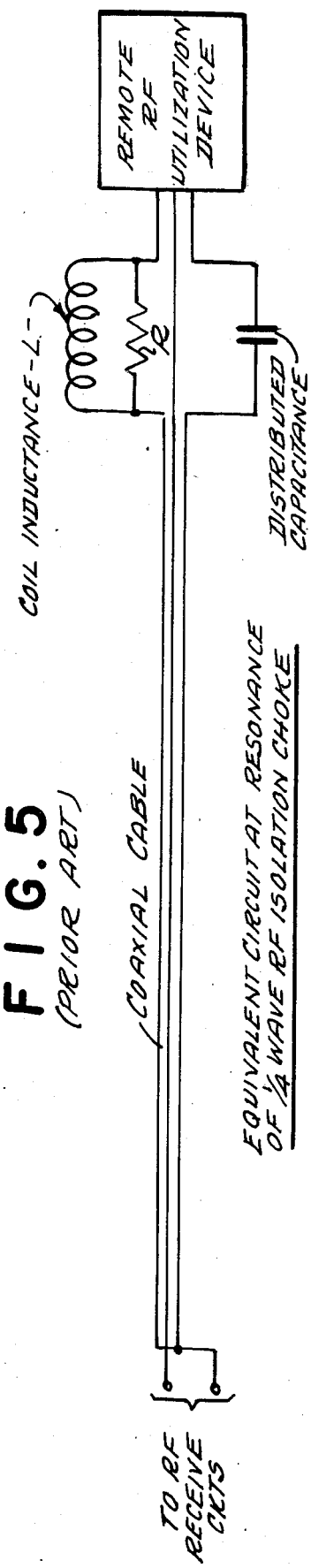
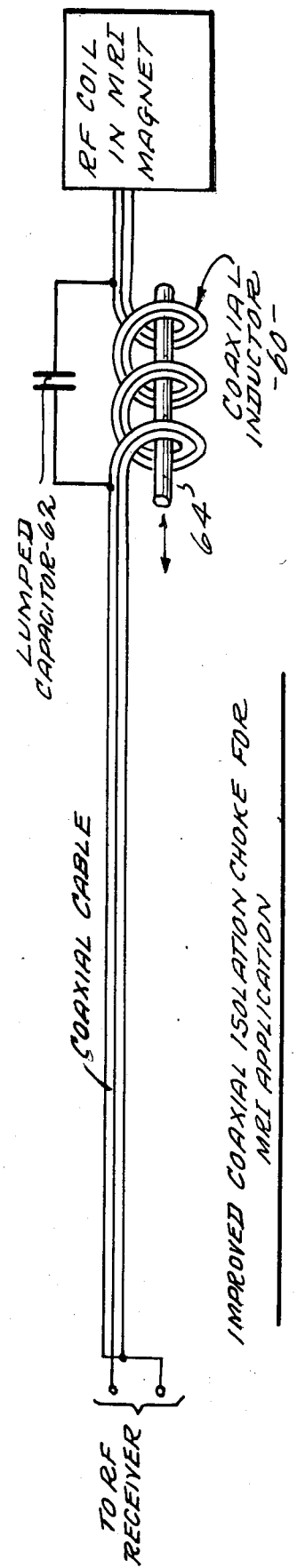

RF COIL COUPLING FOR MRI WITH TUNED RF REJECTION CIRCUIT USING COAX SHIELD CHOKE

This invention generally relates to radio frequency interference chokes designed to impede the flow of spurious RF currents on the outside of the outer conductor of a coaxial cable. The invention has particular application to an improved magnetic resonance imaging (MRI) system where the coaxial cable radio frequency interference (RFI) choke assembly is employed in connection with at least one RF coaxial cable transmission line utilized to couple MRI processing circuits with a remotely located RF coil assembly (e.g., housed in a cryogenic magnet and magnetic gradient coils and the like).

Magnetic resonance imaging (MRI) is now coming into wide spread commercial usage. The technique necessarily must transmit RF signals of predetermined frequency (e.g., approximately 15 MHz in some machines, the frequency depending upon the magnitude of magnetic fields employed and the magnetogyric ratio of the atoms to be imaged). Typically, exciting pulses of RF energy of a specific frequency are transmitted via an RF coil structure into an object to be imaged and, a short time later, radio frequency NMR responses are received via the same or similar RF coil structure. As will be appreciated by those in the art, it is possible to derive imaging imformation from such RF responses.

As will also be understood in the art, one significant limiting factor on the quality of such images is the attainable signal-to-noise ratio of the RF responses which must be detected and processed. One source of noise input to the MRI processing circuits can result from the coupling of stray RF fields over the outside of the outer coaxial cable conductor.

In brief summary, it is, of course, necessary to include some sort of RF transmission line between the MRI processing circuits (including suitable RF transmit/receive circuits) and the RF coil structure or "applicator" which must necessarily be remotely housed within the cryogenic magnet and magnetic gradient coils. For various reasons, coaxial cable is one preferred form of such transmission line.

Insofar as the desired RF signals are concerned, they are carried entirely on the inside of such a coaxial cable transmission line. Indeed, due to the skin effect at RF frequencies, the desired RF signal fields will be contained substantially entirely within the inside surface of the outer coaxial cable conductor.

At the same time, it is impossible to avoid the existence of an outside conductive surface to such an outer coaxial cable conductor. Accordingly, this outside surface may, if care is not taken, constitute a secondary "transmission line" for transmitting unwanted spurious RF fields from the vicinity of the RF coil structure into the sensitive RF circuits of the MRI processor. If such spurious RF signals are so transmitted, this presents a problem and a degradation of the attainable signal-to-noise ratio of the overall system. Accordingly such secondary transmission of spurious RF signals is to be avoided.

The general problem of avoiding secondary transmission of unwanted RF fields over the outside of a coaxial cable has previously been addressed in this and/or in other contexts. For example, it is often desired to minimize such a transmission path from various types of radio transmitting apparatus so as to avoid interference with standard broadcast television signals or the like. One such prior art technique has been to employ a quarter-wave resonant choke in the outer surface path by simply winding a sufficient length of the coaxial cable into a multi-turn coil. The distributed capacitance between turns and the inductance caused by the winding can eventually accumulate sufficiently to form an effective parallel resonance circuit at a frequency of interest and thus impede the transmission of unwanted RFI at such frequency.

However, because such prior structures are typically of relatively low Q, they typically have rather broad effective bandwidth (which is typically a desirable characteristic in some applications)—but, for the same reason, the effective impedance of the parallel resonant circuit is relatively low. In short, although some extra impedance is inserted in the RFI path over a relatively wide bandwidth, the peak magnitude of such impedance is relatively low. In addition, a relatively long length of cable may have to be coiled to achieve the desired effect (e.g., at 15 MHz, a quarter-wavelength is on the order of 5 meters) thus making a relatively bulky and inconvenient assembly.

We have discovered a novel coaxial cable RFI choke assembly structure which is of improved, more compact form—while at the same time providing a relatively higher Q parallel resonant circuit which can be tuned to substantially match in frequency unwanted RFI in an MRI system. Such a choke has especially good application in magnetic resonance imaging systems where the unwanted RFI is typically substantially all of a known relatively narrow range of predetermined frequency—centered at the nominal RF frequency of operation for the MRI system (e.g., typically about 15 MHz in some commercial MRI systems).

Our coaxial cable RFI choke assembly includes an outer conductive member of the coaxial cable having plural turns which, insofar as the outer conductive member is concerned, provides a certain inductance L and a lumped fixed capacitance C connected in parallel across the coil section. The inductance L and capacitance C are chosen so as to present a parellel resonant circuit at approximately the desired predetemined frequency. In addition, in the exemplary embodiment, a conductive tuning rod is positioned within the center of the coil section so as to achieve more precise parallel resonance substantially at the predetermined RFI frequency of interest.

An adhesive is preferably utilized to fix the tuning rod and the coiled section of coaxial cable in place relative to one another and with respect to a forming cylinder of insulating material having the coiled section of coaxial cable wound thereonto and having a central cavity into which the tuning rod is located. The entire assembly is then placed within a cylindrical housing, closed on each end, and encapsulated (e.g., with heat shrink plastic material) having a coaxial cable input connection disposed through one end of the housing and a coaxial cable output connection disposed through the end of the housing.

These as well as other objects and advantages of the invention will be more completely understood and appreciated by carefully reading the following detailed description of a presently preferred exemplary embodiment, taken in conjunction with the drawings, of which:

FIG. 1 is a schematic block diagram of an MRI system utilizing the RFI choke of this invention;

FIGS. 2–5 illustrate various prior art techniques for achieving balanced RF feed and (in the case of FIGS. 4–5) a degree of RFI impedance via a quarter wavelength resonant choke formed in the outer surface of a coaxial cable;

FIG. 6 is a schematic diagram of an improved coaxial isolation choke in accordance with this invention and especially suited for MRI application;

FIGS. 7 and 8 illustrate the assembly and construction of the presently preferred exemplary embodiment of our improved coaxial cable RFI choke assembly; and FIG. 9 depicts the final assembly of the exemplary embodiment in a cylindrical housing.

An abbreviated schematic depiction of a magnetic resonance imaging (MFI) system is depicted in FIG. 1. As shown, the system typically includes a very large cryogenic magnet and magnetic gradient coils 10 (the magnetic gradient coils are typically pulsed to provide different gradient fields at different times in the imaging process). Located within this rather massive assembly 10 is an RF coil structure 12 which communicates via transmission line 14 with external RF transmit and receive circuits 16. Suitable control circuits 18 control the magnetic gradient coils as well as the RF transmit/receive section 16, the MRI image processor 20 and, possibly, even the display output 22. Relevant to the present invention, is the fact that the RF coil 12 must be linked via the transmission line 14 to the RF transmit/receive circuits 16 which are typically necessarily located externally (e.g., several meters from the RF coil 12).

As previously indicated, while desired RF signals are coupled via the inside of coaxial cable 14, there are also unwanted RF fields which may couple to the outside of coaxial cable 14. So as to substantially impede the flow of such unwanted signals, the RFI choke 24 of this invention is serially inserted in the circuit on the outside of the outer conductor of coaxial cable 14.

In general, balanced RF input/output feed is required for MRI RF coils. There are numerous ways to achieve such a balanced feed and a couple of them are depicted in FIGS. 2–3. For example, in lieu of a fully balanced overall RF circuit, a balun circuit may be employed in conjunction with an unbalanced coaxial feedline as depicted in FIG. 2 or, alternatively, series circuit tuning capacitors may be utilized in conjunction with a coaxial cable as depicted in FIG. 3. In any case, however, the desired RF fields will be transmitted solely on the inside of the coaxial cable and the outside surface of the outer conductor of the coaxial cable will be available as a secondary spurious transmission line for unwanted RF fields. For example, in the approach of FIG. 3, although one attempts to balance the fringing fields to ground via the coupling capacitors, complete balance generally may not be achieved because of an intricate relationship between the fringing field balance and that of the series capacitors, etc.

Accordingly, in an attempt to keep the outside surface fo the coaxial cable isolated (i.e., to insure substantial impedance to the unwanted transmission of spurious RF fields over the outside surface), a so-called quarterwave RF isolation choke may typically be employed as shown in FIG. 4 (and for which an equivalent circuit at resonance is shown in FIG. 5). The turns length of the quarterwave choke is typically approximately one-fourth wavelength at the choke frequency at which parallel resonance occurs, at least in part, because of distributed capacitance effects. Thus, with respect to the unwanted fringing fields, the remote RF utilization device (e.g., an RF coil in an MRI magnetic apparatus) is left essentially floating. However, the "floating" effect is considerably less than optimum because of a typically low Q-factor for such a quarterwave choke. Because of the low Q, the choke will have some increased impedance effect over a relatively wide band of frequencies. While this may be sufficient (or even desirable) for some applications, the higher Q choke structure of this invention is preferred for MRI applications and an exemplary embodiment of it is depicted at FIG. 6.

As depicted in FIG. 6, our improved coaxial isolation choke for MRI application utilizes a relatively shorter length of coiled coaxial inductor 60 (i.e., shorter than that necessary for the quarterwave isolation choke using only distributed capacitance effects). To achieve the desired parallel resonant impedance for spurious RFI, a lumped capacitor 62 is connected across the coaxial inductor 60. Accordingly, insofar as the RFI circuit on the outside of the outer coaxial cable conductor is concerned, a parallel resonant circuit of relatively high Q may be realized. A conductive rod 64 is then preferably positioned axially within inductor 60 so as to fine tune or "trim" the resonant frequency to the desired value for a particular MRI system.

The coaxial cable RFI choke assembly of this invention is preferably of the structure and form depicted at FIGS. 7–9. Here, an acrylic core 70 has a central aperture. The coaxial inductor 60 is wound about the outside of the core 70 while the tuning rod 64 is positioned within the central cavity of the core 70 as depicted in FIG. 7. In the exemplary embodiment, the acrylic core may, for example, be formed from a 2 inch section of ¾ inch diameter having a ¼ inch diameter hole drilled along its center.

Coil 60, in one exemplary embodiment, may comprise nine turns of conventional 50 ohm low noise coaxial cable wrapped about the core 70 and secured with fiber tape or the like. Approximately 1½ inch of coaxial cable may initially be left at each end for later connection purposes as depicted in FIG. 7. For a nominal choke freqency of approximately 15 MHz, one exemplary embodiment of 9 turns of coil 60 provides approximately 65–80 ohms of inductive impedance at the desired operating frequency.

Next, a fixed capacitor 62 (e.g., 150 picofarads, 10%) may be mounted directly to one end of the acrylic core 70 and a copper sheet lead line (e.g., ½ inch wide and 0.20 inch thick) 72, 74 may be utilized to connect the terminals of the capacitor 62 to either end of the outer braid of the coaxial inductor 60. For example, as shown in FIG. 8, copper lead 72 will extend along one side of coil 60 to the other end of the structure while yet maintaining a very compact assembly. As will be understood, the coaxial cable 60 typically includes an outer insulating coating which naturally insulates copper leads 72 from the outer braid which is exposed and connected to the copper leads 72, 74 only at the desired connection points at the two opposite ends of the coil 60 structure.

As depicted in FIG. 8, the tuning rod 64, (e.g., a ¼ inch diameter brass, copper or aluminum rod section) is insertd within the central cavity of core 70 so as to tune or "trim" the resonant frequency to the precisely desired value. In one exemplary embodiment, a resonant frequency of 15 MHz is achieved by positioning rod 64 while observing the measured resonant frequency using conventional RF impedance measuring instruments and a parallel resonant impedance across the assembly of approximatley 5 to 6 KΩ is obtained.

Once the assembly is properly tuned, then an adhesive (e.g., glyptol or epoxy) is used to secure the rod 64 into place. A type C bulkhead coaxial cable connector may then be attached to an acrylic plate and soldered to the inner and outer conductors of the coaxial cable at one end. The other end of the coil 60 may be attached to a coaxial cable fed through an acrylic plug (e.g., 1×1.25 inch) 76 similar to the plug 78 used at the other end of the structure and epoxied in place. In one exemplary embodiment, the distance from the "C" type connector at the end of the coaxial cable to the surface of the acrylic plug 76 is 2 and ⅜ inch. The coil assembly with attached acrylic plug 76, 78 is then installed into an acrylic tube 80 (e.g., 6 inch long with a 1.5 inch outside diameter and 1.25 inch inside diameter) where the acrylic plug ends 76, 78 are glued in place and a further encapsulating heat shrink tube 82 is placed over the entire assembly and shrunk into place.

While only one exemplary embodiment of this invention has been described in detail, those skilled in the art will recognize that there may be many modifications and variations of this exemplary embodiment which yet retain many of the novel features and advantages of this invention. Accordingly, the appended claims are intended to cover all such variations and modifications.

What is claimed is:

1. A coaxial cable RFI choke assembly for reducing transmission, via the outside of the outer coaxial conductor, of RF signals having a predetermined frequency while passing RF signals of the same predetermined frequency on the inside of said coaxial conductor, said assembly comprising:

a coiled section of coaxial cable having an outer conductive member and including plural coil turns between first and second coil ends which cable, insofar as the outer conductive member is concerned, provides inductance L;

a lumped fixed capacitor of capacitance C physically disposed transversely across one of said coil ends and electrically connected in parallel across both of said coil ends, said inductance L and capacitance C presenting a parallel resonant circuit approximately at said predetermined frequency which substantially impedes the flow of said RF signals via the outside of the outer conductive member;

a conductive tuning rod positioned within the center of said coiled section so as to achieve parallel resonance of the assembly substantially at said predetermined frequency;

adhesive material fixing said tuning rod and coiled section of coaxial cable in place relative one another;

a forming cylinder of insulationg material with said coiled section of coaxial cable being wound thereonto and having a cavity in its center section into which said tuning rod is located; and a cylindrical housing, closed on each end, encapsulating said assembly, having a coaxial cable input connection disposed at one end of the housing and a coaxial cable output connection disposed at the other end of the housing.

2. A magnetic resonance imaging (MRI) system including:

a cryogenic magnet, pulsed magnetic gradient coils disposed within said magnet, an RF transmit/receive coil assembly mounted within said gradient coils and communicating RF signals of predetermined frequency $f_1$ via at least one coaxial cable to/from remotely located MRI processing circuits including RF signal transmitting and receiving circuits, a coaxial cable RFI choke assembly disposed serially in said coaxial cable and within said gradient coils to reduce transmission of spurious RF signals of said predetermined frequency $f_1$ otherwise received via the outside of an outer coaxial cable conductor, said assembly including:

a coiled section of coaxial cable having an outer conductive member and including plural coil turns which, insofar as the outer conductive member is concerned, provides inductance L; and a lumped fixed capacitor of capacitance C connected in parallel across said coiled section, said inductance L and capacitance C presenting a parallel resonant circuit approximately at said predetermined frequency $f_1$ which circuit substantially impedes the flow of said RF signals via the outside of the outer conductive member.

3. An improved MRI system as in claim 2 wherein said coaxial cable RFI choke assembly further comprises:

a conductive tuning rod positioned within the center of said coiled section so as to achieve parallel resonance of the assembly substantially at said predetermined frequency.

4. An improved MRI system as in claim 3 wherein said coaxial cable RFI choke assembly further comprises:

adhesive material fixing said tuning rod and coiled section of coaxial cable in place relative one another.

5. An improved MRI system as in claim 1 wherein said coaxial cable RFI choke assembly further comprises:

a cylinder of insulating material with said coiled section of coaxial cable being wound thereonto externally and having a cavity in its center section into which said tuning rod is located.

6. An improved MRI system as in claim 5 wherein said coaxial cable RFI choke further comprises:

a cylindrical housing, closed on each end, encapsulating said assembly, having a coaxial cable input connection disposed at one end of the housing and a coaxial cable output connection disposed at the other end of the housing.

* * * * *